(12) United States Patent
Anderson et al.

(10) Patent No.: US 10,714,616 B2
(45) Date of Patent: Jul. 14, 2020

(54) FINFET HAVING A GATE STRUCTURE IN A TRENCH FEATURE IN A BENT FIN

(71) Applicant: GLOBALFOUNDRIES INC., Grand Cayman (KY)

(72) Inventors: Brent A. Anderson, Jericho, VT (US); Andres Bryant, Burlington, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/678,206

(22) Filed: Aug. 16, 2017

(65) Prior Publication Data

US 2018/0012988 A1 Jan. 11, 2018

Related U.S. Application Data

(62) Division of application No. 13/492,108, filed on Jun. 8, 2012, now Pat. No. 9,768,304, which is a division
(Continued)

(51) Int. Cl.
*H01L 29/78* (2006.01)
*H01L 21/8238* (2006.01)
(Continued)

(52) U.S. Cl.
CPC .... *H01L 29/785* (2013.01); *H01L 21/823807* (2013.01); *H01L 21/823821* (2013.01);
(Continued)

(58) Field of Classification Search
CPC ........... H01L 29/41791; H01L 29/7848; H01L 29/785; H01L 29/7845; H01L 29/7849
See application file for complete search history.

(56) References Cited

U.S. PATENT DOCUMENTS

| 5,736,435 A | 4/1998 | Venkatesan et al. |
| 6,117,712 A | 9/2000 | Wu |

(Continued)

FOREIGN PATENT DOCUMENTS

| JP | 2004-193596 | 7/2004 |
| JP | 2005-175495 | 6/2005 |

(Continued)

OTHER PUBLICATIONS

C.L. Huang et al., LOCOS-Induced STress Effects on Thin-Film SOI Devices. IEEE 1997, pp. 646-650.
(Continued)

*Primary Examiner* — Anh D Mai
(74) *Attorney, Agent, or Firm* — Michael LeStrange; Andrew M. Calderon; Roberts Calderon Safran & Cole, P.C.

(57) ABSTRACT

A semiconductor device including semiconductor material having a bend and a trench feature formed at the bend, and a gate structure at least partially disposed in the trench feature. A method of fabricating a semiconductor structure including forming a semiconductor material with a trench feature over a layer, forming a gate structure at least partially in the trench feature, and bending the semiconductor material such that stress is induced in the semiconductor material in an inversion channel region of the gate structure.

20 Claims, 15 Drawing Sheets

Related U.S. Application Data of application No. 12/875,416, filed on Sep. 3, 2010, now Pat. No. 8,198,682, which is a division of application No. 11/561,488, filed on Nov. 20, 2006, now Pat. No. 7,829,407.

(51) Int. Cl.
- *H01L 27/12* (2006.01)
- *H01L 29/10* (2006.01)
- *H01L 29/66* (2006.01)
- *H01L 21/3115* (2006.01)
- *H01L 21/762* (2006.01)

(52) U.S. Cl.
CPC .. *H01L 21/823878* (2013.01); *H01L 27/1203* (2013.01); *H01L 29/1037* (2013.01); *H01L 29/66795* (2013.01); *H01L 29/7843* (2013.01); *H01L 29/7846* (2013.01); *H01L 29/7849* (2013.01); *H01L 21/31155* (2013.01); *H01L 21/76283* (2013.01); *H01L 29/66621* (2013.01)

(56) References Cited

U.S. PATENT DOCUMENTS

| | | |
|---|---|---|
| 6,242,777 B1 | 6/2001 | Mano et al. |
| 6,656,810 B1 | 12/2003 | Fukushima |
| 6,660,598 B2 | 12/2003 | Hanafi et al. |
| 6,677,646 B2 | 1/2004 | Ieong et al. |
| 6,717,216 B1 | 4/2004 | Doris et al. |
| 6,764,884 B1 * | 7/2004 | Yu ................. H01L 29/42392 257/E21.444 |
| 6,797,579 B2 | 9/2004 | Yoo et al. |
| 7,078,722 B2 | 7/2006 | Anderson et al. |
| 7,217,602 B2 | 5/2007 | Koh |
| 7,400,031 B2 | 7/2008 | Anderson |
| 7,538,391 B2 | 5/2009 | Chidambarrao et al. |
| 8,039,929 B2 | 10/2011 | Anderson et al. |
| 2003/0201458 A1* | 10/2003 | Clark .................. H01L 29/1054 257/192 |
| 2005/0064646 A1 | 3/2005 | Chidambarrao et al. |
| 2005/0106799 A1 | 5/2005 | Doris et al. |
| 2005/0130358 A1 | 6/2005 | Chidambarrao et al. |
| 2005/0142788 A1 | 6/2005 | Chidambarrao et al. |
| 2005/0156154 A1 | 7/2005 | Zhu et al. |
| 2005/0224800 A1 | 10/2005 | Lindert et al. |
| 2005/0236668 A1 | 10/2005 | Zhu et al. |
| 2006/0091461 A1 | 5/2006 | Chen et al. |
| 2006/0125008 A1 | 6/2006 | Chidambarrao et al. |
| 2006/0284255 A1 | 12/2006 | Shin et al. |
| 2007/0063230 A1 | 3/2007 | Anderson et al. |
| 2007/0069294 A1 | 3/2007 | Chidambarrao et al. |
| 2007/0158739 A1 | 7/2007 | Fischetti et al. |
| 2009/0114955 A1 | 5/2009 | Stapelmann et al. |

FOREIGN PATENT DOCUMENTS

| | | |
|---|---|---|
| JP | 2005-311000 | 11/2005 |
| JP | 2007-073800 | 3/2007 |
| JP | 2008-053403 | 3/2008 |
| JP | 2009-531856 | 9/2009 |
| WO | 2005122276 | 12/2005 |

OTHER PUBLICATIONS

International Search Report and Written Opinion issued in connection with International Application PCT/US2007/085246.

W-G. En et al. "Reduction of STI/Active stress on 0.18 μm SOI Devices Through Modification of STI Process", IEEE 2001, pp. 85-86.

J-W Lee et al. "Hot-Carrier Degradation Behavior of Thin-Film SOI nMOSFET with Isolation Scheme and Buried Oxide Thickness", IEEE 2000, pp. 1013-1017.

* cited by examiner

FINFET HAVING A GATE STRUCTURE IN A TRENCH FEATURE IN A BENT FIN

CROSS REFERENCE TO RELATED APPLICATIONS

The present application is a divisional application of U.S. patent application Ser. No. 13/492,108, filed on Jun. 8, 2012, which is a divisional application of U.S. patent application Ser. No. 12/875,416, filed on Sep. 3, 2010, now U.S. Pat. No. 8,198,682, which is a divisional application of U.S. patent application Ser. No. 11/561,488, filed on Nov. 20, 2006, now U.S. Pat. No. 7,829,407, the disclosures of all of which are expressly incorporated by reference herein in their entirety.

FIELD OF THE INVENTION

The invention generally relates to a semiconductor device and methods for manufacturing a semiconductor device with improved device performance, and more particularly to a dual stress semiconductor device and methods for manufacturing the same by imposing dual tensile and compressive stresses.

BACKGROUND

Mechanical stresses (e.g., tensile stress and compressive stress) within a semiconductor device can modulate device performance, which means stresses within a semiconductor substrate enhance semiconductor device characteristics. Thus, the characteristics of a semiconductor device can be improved by creating tensile and/or compressive stresses in the channel regions of an N type device (e.g., NFET) and/or a P type device (e.g., PFET). However, the same stress component, either tensile or compressive stress, discriminatively affects the characteristics of an N type device and a P type device. For example, when tensile stress is applied to a device in the direction of current flow, the performance of an N type device is enhanced but the performance of a P type device is degraded. Thus, in order to maximize the performance of both N type and P type devices formed on the same semiconductor substrate, each stress component should be selectively engineered and applied to either NFETs or PFETs.

To selectively create tensile stress to an N type device and compressive stress to a P type device, respectively, distinctive processes and different combinations of materials are used. For example, a trench isolation structure can be used in forming N type and P type devices. When the trench isolation structure is formed, an isolation region for the N type device contains the isolation material which applies appropriate stress to the N type device in a longitudinal direction and in a transverse direction. Further, the first isolation region and the second isolation region are provided for the P type device, which apply a unique mechanical stress on the P type device in the longitudinal direction.

Alternatively, liners can be formed on the side surfaces of a gate electrode, to selectively induce appropriate stress types in the channels of the N type or P type devices. By providing liners, it is possible to apply appropriate stress closer to the device than relying on the trench isolation fill technique.

While these methods enable selectively applying tensile stress to the N type device and compressive stress to the P type device along the longitudinal direction, they require more complicated processing steps and specific materials, thereby increasing manufacturing costs. Further, only a moderate amount of stress is obtained, such as only in the order of hundreds of MPa.

Accordingly, there exists a need in the art to overcome the deficiencies and limitations described hereinabove.

SUMMARY

In a first aspect of the invention, there is provided a semiconductor structure comprising semiconductor material having a bend and a trench feature formed at the bend. The semiconductor structure further comprises a gate structure at least partially disposed in the trench feature.

In a second aspect of the invention, there is a semiconductor structure comprising a semiconductor fin having a first side, a second side opposite the first side, and a bend. The semiconductor structure further comprises a gate structure arranged at the first side of the semiconductor fin such that an inversion channel area of the gate structure is at least partially disposed in a region of the semiconductor fin having stress induced by the bend.

In a third aspect of the invention, there is a method of fabricating a semiconductor structure comprising forming a semiconductor material with a trench feature over a layer, and forming a gate structure at least partially in the trench feature. The method further comprises bending the semiconductor material such that stress is induced in the semiconductor material in an inversion channel region of the gate structure.

In a fourth aspect of the invention, there is a method of fabricating a semiconductor structure comprising forming a semiconductor fin having a first side and a second side opposite the first side. The method further comprises bending the semiconductor fin such that tensile stress is induced in a first region of the semiconductor fin and compressive stress is induced in a second region of the semiconductor fin. The method further comprises forming a gate structure on the semiconductor fin such that an inversion channel of the gate structure is disposed at least partially in the first region.

DETAILED DESCRIPTION

The invention is directed to semiconductor devices and methods for manufacturing semiconductor devices with improved device performance, and more particularly to dual stress semiconductor devices and methods for manufacturing the same by imposing dual tensile and compressive stresses. At least one implementation of the invention employs thermal oxidation to dually stress opposite portions of silicon-on-insulator (SOI). In this manner, the invention provides improved mobility for NFETs and PFETs.

Figure 1:
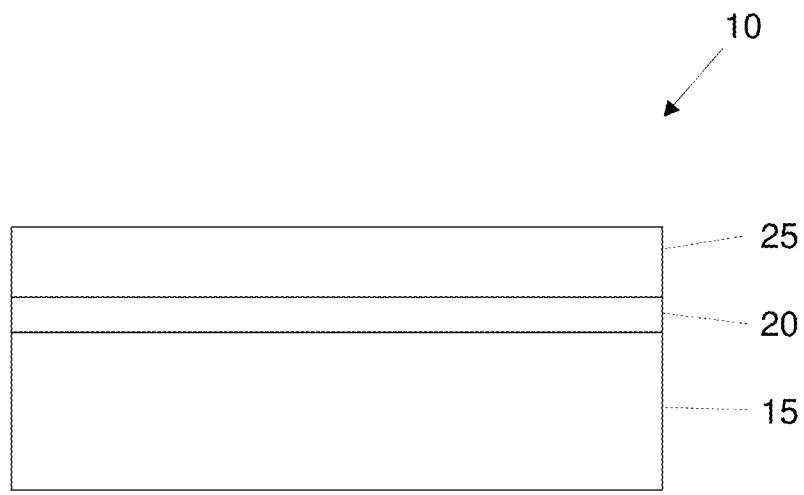
FIGS. 1-5 show steps of a process for fabricating a semiconductor device according to aspects of the invention.

FIG. 1 shows an exemplary substrate structure 10 employed in the invention. More particularly, a silicon-on-insulator (SOI) type substrate structure is shown, although other substrate structures may be implemented with the invention. The substrate structure 10 has a semiconductor substrate 15, which is typically a silicon substrate, a buried oxide (BOX) layer 20 formed on the substrate 15, and a semiconductor layer 25, which is typically a silicon layer, formed on the buried oxide layer 20. The semiconductor layer 25 may be comprised of various semiconductor materials, such as, for example, Si, SiGe, SiC, SiGeC, etc. The substrate structure 10 may be fabricated using techniques well know to those skilled in the art. For example, the substrate structure 10 may be formed by conventional bonding and cutting processes, or alternatively, a conventional separation by implantation of oxygen (SIMOX) process. The silicon substrate 15 may have any desired thickness based upon the intended use of the final semiconductor device. In embodiments, the BOX layer 20 has a thickness of about 20 nanometers (nm) to about 100 nm, and the semiconductor layer 25 has a thickness of about 15 nm to about 45 nm.

Figure 2:
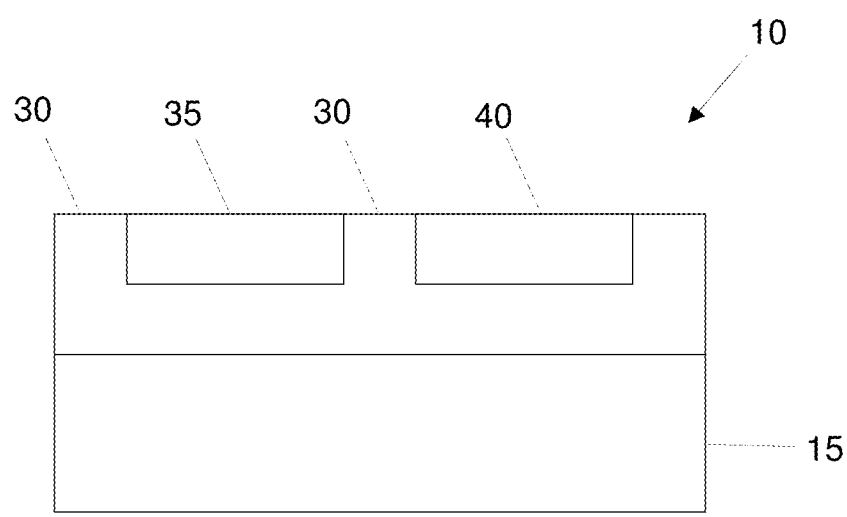

FIG. 2 shows the substrate structure after the formation of isolation structures 30, such as shallow-trench-isolation structures (STI). Techniques known in the art may be utilized to form STIs 30. A conventional technique entails patterning with a photoresist, etching the trench, chemical vapor deposition of oxide to fill the trench, and planarizing the surface such as by chemical mechanical polishing.

Creation of the STIs 30 results in the formation of SOI islands 35, 40. In implementations, each island 35, 40 may accommodate a gate device. For example, a first SOI island 35 may accommodate a P type device, and a second, possibly adjacent, SOI island may accommodate an N type device. It is understood, however, that any number of islands may be formed, and any configuration of P type and N type devices, as described herein, may be employed.

Figure 3:
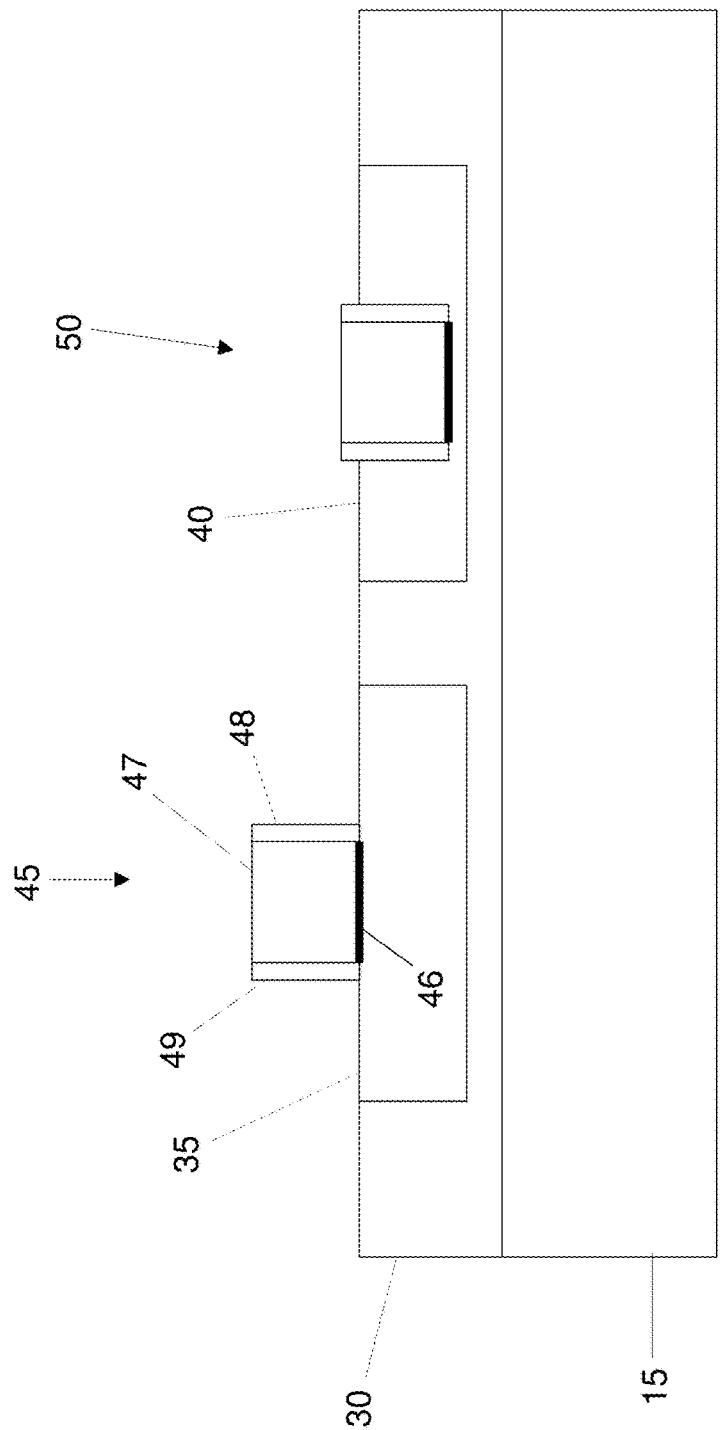

In the exemplary embodiment shown in FIG. 3, a first gate 45 is formed on the first SOI island 35. The first gate 45 may comprise a standard gate formed in any conventional manner. For example, the first gate 45 may be fabricated by first forming gate dielectric 46 on an exposed surface (e.g., top) of the SOI island 35. The gate dielectric layer 46 may be formed by a conventional deposition process such as CVD or plasma-assisted CVD, or a thermal growing process such as oxidation, nitridation or oxynitridation. The gate dielectric 46 may include any device quality dielectric material such as an oxide, nitride, oxynitride or any combination and multilayer thereof. The thickness of the gate dielectric is not critical to the present invention.

The gate stack 47 is formed on the gate dielectric 46 utilizing a conventional deposition process such as CVD, plasma-assisted CVD or plating. The gate stack 47 may include a gate material such as polysilicon, amorphous silicon or other materials suitable for MOSFET gate composition. The gate material may be formed on the surface of gate dielectric 46 utilizing conventional deposition processes well known in the art such as, for example, CVD or plasma-assisted CVD. An optional dielectric-capping layer (not shown) may be present atop the gate material. When present, the optional dielectric-capping layer may typically be comprised of an oxide, nitride or oxynitride and formed utilizing a conventional deposition process such as, for example, CVD or plasma-assisted CVD. Alternatively, a conventional thermal growing process such as, for example, oxidation, may be used in forming an optional dielectric-capping layer.

Following formation of the gate stack 47 on the gate dielectric layer 46, the gate stack 47 and gate dielectric layer 46 are subjected to a conventional patterning process which includes lithography and etching steps. By way of example, the lithography step may entail applying a photoresist, exposing the photoresist to a pattern of radiation, and developing the pattern utilizing a conventional resist developer. Following the lithography step, a conventional etching process such as reactive-ion etching, plasma etching, ion beam etching or laser ablation may be employed in transferring the pattern to the gate stack 47 and the gate dielectric 46.

Spacers 48 and 49 are formed along gate sidewalls. For example, spacer material such as a nitride (e.g., $Si_3N_4$) may be deposited in a conventional manner, such as by chemical vapor deposition (CVD) using a silane source. Other techniques, which may be suitable for deposition of a nitride layer, include low-pressure CVD (LPCVD) and atmospheric pressure (CVD) (APCVD). Portions of the deposited nitride layer are subsequently etched away in a conventional manner to form the spacers 48 and 49.

As further shown in FIG. 3, a second gate 50 is formed in the second SOI island 40. More, particularly, the second gate 50 is disposed in a trench, or similar structure, in the second SOI island 40. The second gate 50 may be formed using known trench-gate techniques, such as, for example a damascene process. For example, the second gate may be formed by selectively applying a mask over portions of the second SOI island 40, performing reactive ion etching (RIE) to remove material to form the trench, depositing gate oxide in the trench, forming sidewall spacers in the trench, and depositing gate material (e.g., polysilicon) in the trench above the gate oxide and between the sidewall spacers.

It is noted that the top surface of the gate material of the second gate 50 may be substantially planar with the top surface of the second SOI island 40, or it may extend above the top surface of the second SOI island 40, as dictated by intended use of the finished semiconductor device. Furthermore, in embodiments, the topmost surface of the second gate 50 is disposed elevationally lower than the topmost surface of the first gate 45. Even further, in embodiments, the trench has a depth of at least 70% of the thickness of the second SOI island 4. In an exemplary implementation, the thickness of the remaining SOI layer below the trench is be about 15 nm, although other thicknesses are contemplated within the scope of the invention.

Figure 4:
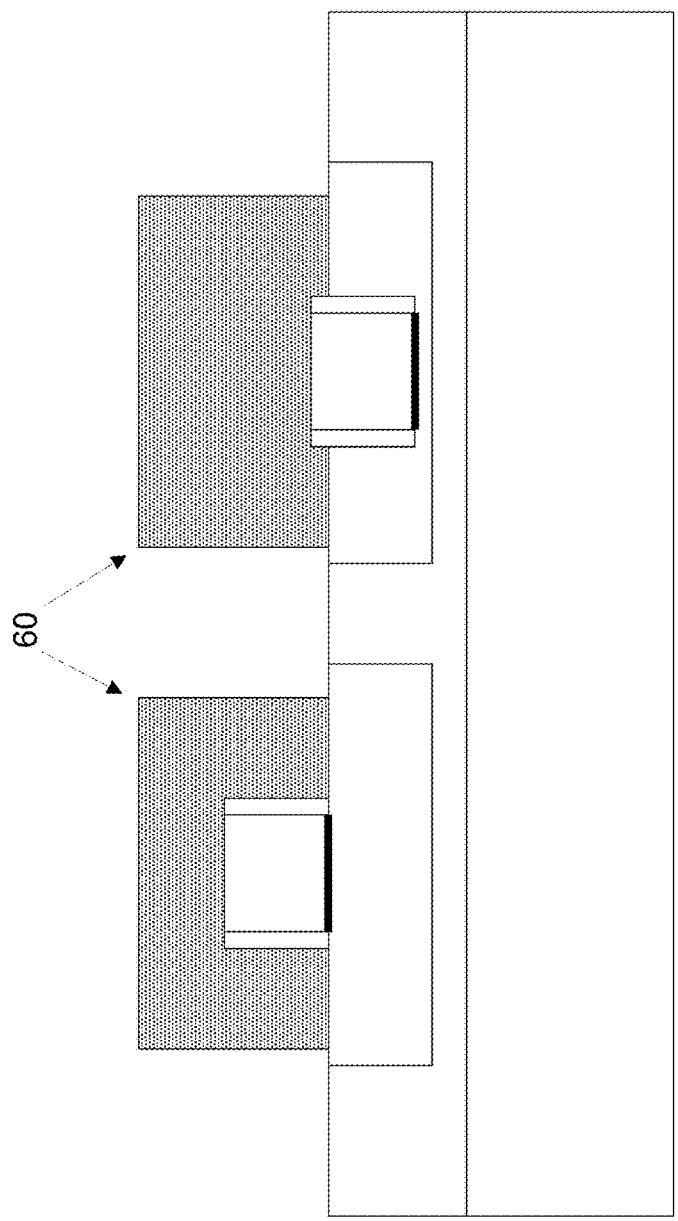

Next, as shown in FIG. 4, the first and second gate regions are blocked off by depositing nitride 60, or similar mask material, over the gate regions. In the implementation shown in FIG. 4, the nitride 60 does not cover the entirety of the first and second SOI islands 35, 40. However, it is contemplated within the scope of the invention to deposit the nitride substantially even with the edge, or extending slightly over the edge, of the SOI islands 35, 40.

Figure 5:
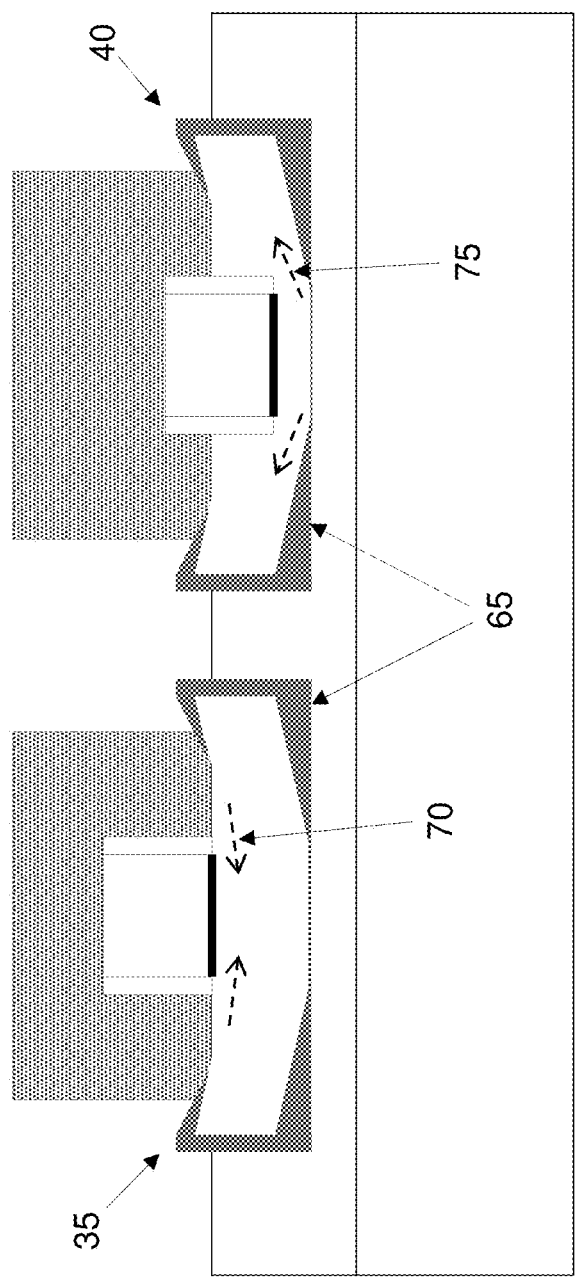

Next, as depicted in FIG. 5, the top portion of the structure is oxidized. For example, a conventional thermal oxidation (wet or dry) may be performed in the range of about 500° C. to about 1200° C. This oxidation step causes the formation of oxide material around the portions of the SOI islands 35, 40 that are not protected by the nitride 60. In particular, the oxidation step causes the formation of "bird's beaks" 65 under the ends of the SOI islands 35, 40. These bird's beaks 65 push the ends of the SOI islands 35, 40 upward, thereby creating a bend in each SOI islands 35, 40. The amount of deflection in the upward direction depends on a number of factors (including, for example, the BOX layer material, SOI island material, type of thermal oxidation, etc.).

This bending of the SOI islands 35, 40 results in the creation of compressive stress 70 at the base (e.g., inversion channel area) of the first gate, and tensile stress 75 at the base (e.g., inversion channel area) of the second gate. The compressive stress 70 may be in the range of about 0.25 GPa to about 2 GPa, while the tensile stress 75 may be in the range of about 0.25 GPa to about 2 GPa. In an exemplary embodiment of the invention, for an SOI island of silicon having a Young's Modulus of about 180 GPa, a length of about 0.5 μm, and a height of about 160 nm, a deflection of about 1.5 nm in the height direction results in a stress of about 1 GPa at the bend region. In this manner, the mobility of the respective devices may be improved.

Figure 6:
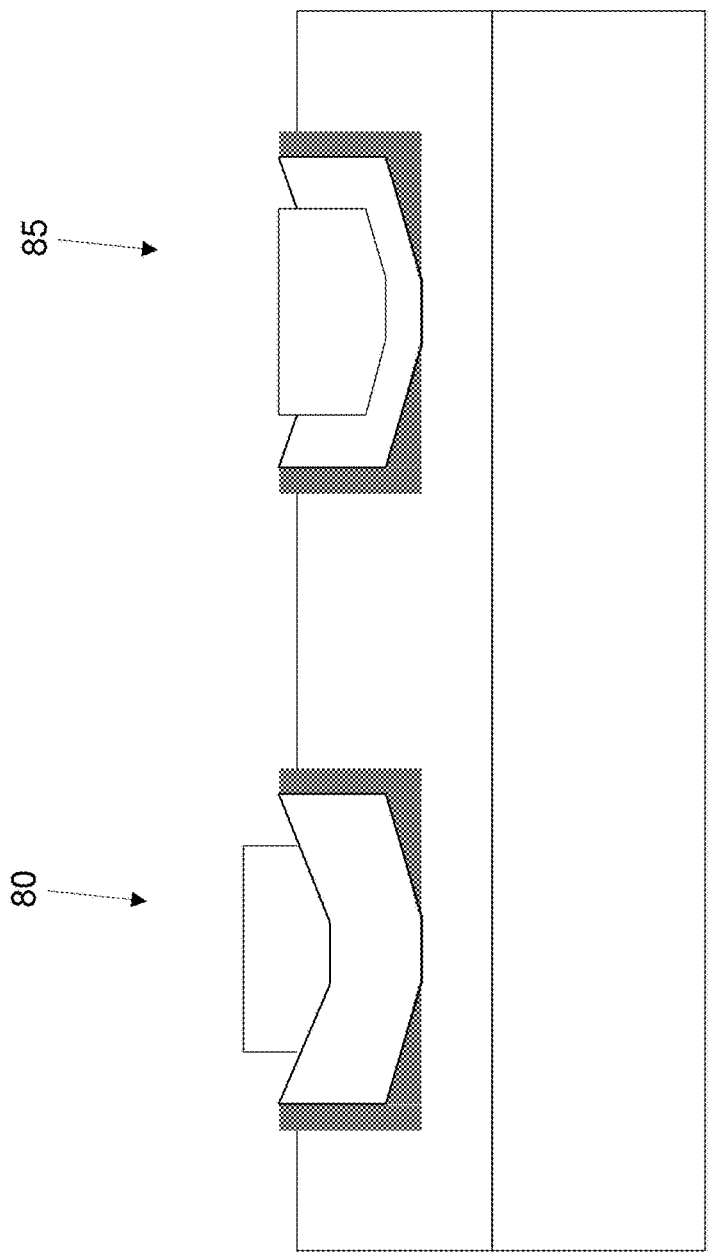
FIG. 6 shows a semiconductor device according to aspects of the invention.

After the oxidation step, the nitride blocks are removed, and standard processing of the device may continue. In embodiments, source and drain regions (not shown) are formed in a conventional manner. For example, a conventional implantation or out-diffusion process may be employed to selectively dope the source and drain regions with appropriate ions known to those of skill in the art. As seen in FIG. 6, the result is a PFET device 80 with improved mobility due to compressive stress application, and an NFET device 85 with improved mobility due to tensile stress application.

Figure 7:
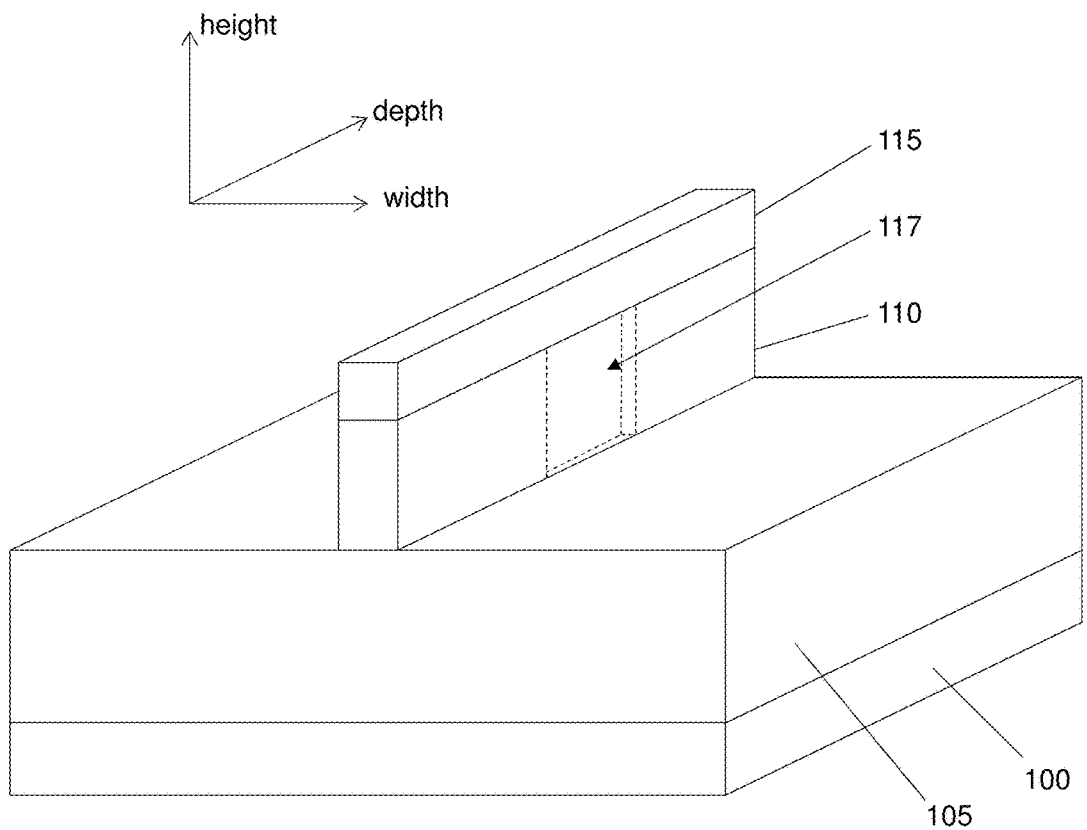
FIGS. 7-11 show steps of a process for fabricating a FINFET semiconductor device according to aspects of the invention.

FIGS. 7-11 show a method of fabricating a FINFET according to aspects of the invention. In embodiments, a buried oxide (BOX) layer 105 is formed atop a substrate 100, as depicted in FIG. 7. A fin 110, comprising, for example, a monolith of silicon, is formed atop the BOX layer 105, and an oxide cap 115 is formed atop the fin 110. The substrate 100, BOX layer 105, fin 110, and oxide cap 115 may be formed using conventional techniques and materials.

In embodiments, the substrate 100 and BOX layer 105 both have a depth of about 350 nm and a width of about 350 nm (where depth, width, and height are defined by the coordinate axis shown in FIG. 7). Furthermore, the fin 110 may have a width of about 15 nm, a height of about 40 nm, and a depth of about 350 nm. Even further, the oxide cap 115 may have a width of about 15 nm, a height of about 20 nm, and a depth of about 350 nm. It is understood, however, that the dimensions of the components may be adjusted according to the intended end use of the device.

Still referring to FIG. 7, a trench feature 117 may be formed in one side of the fin 110. The trench feature 117 may be formed by standard processes, such as, for example, RIE etching. The trench feature 117 is described in greater detail below.

Figure 8:
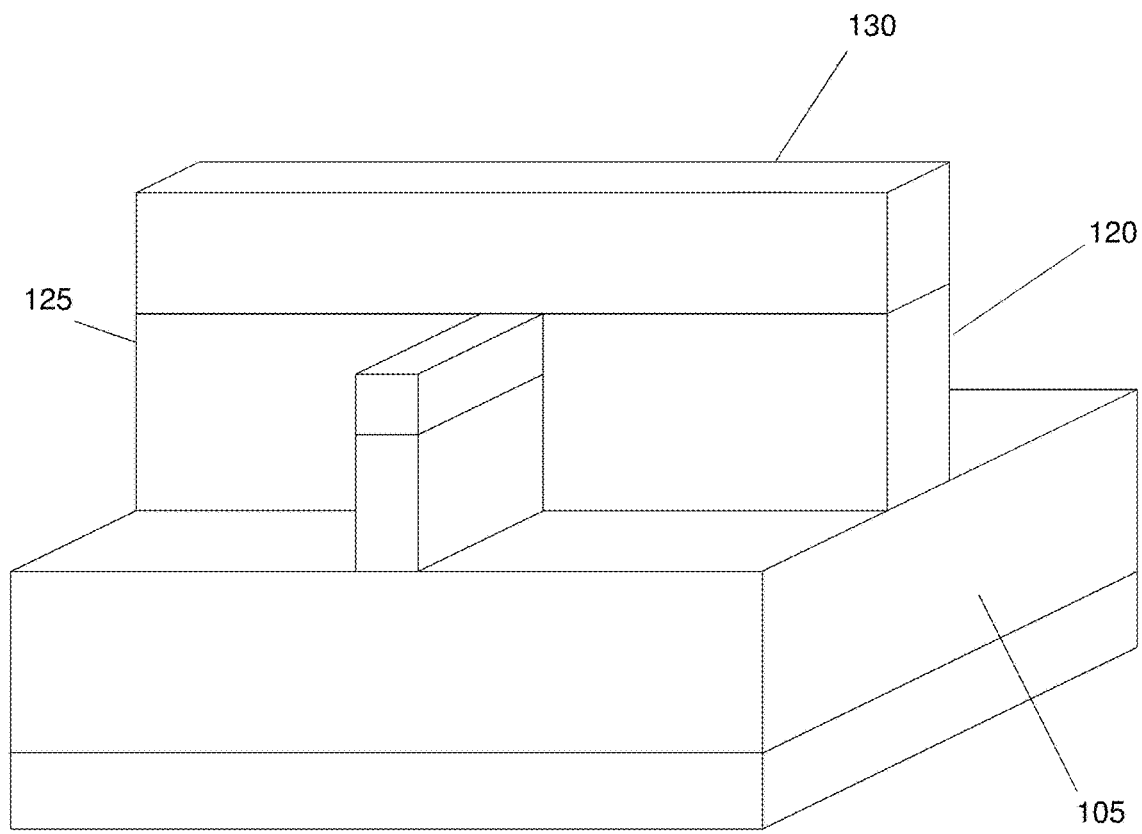

As depicted in FIG. 8, a front gate 120 and back gate 125 are formed atop the BOX layer 105 and adjacent the sides of the fin 110. The gates 120, 125 may be formed in a known manner, such as, for example, chemical vapor deposition (CVD), patterning, and reactive ion etching (RIE), and may comprise conventional materials, such as, for example, polysilicon. In embodiments, each gate 120, 125 has a height of about 60 nm.

Still referring to FIG. 8, a nitride gate cap 130 is formed atop the gates 120, 125 before gate patterning. The nitride gate cap 130 may be formed using conventional techniques, such as for example, CVD, and may comprise conventional materials, such as, for example, SiN. In embodiments, the nitride gate cap has a height of about 60 nm.

Figure 9:
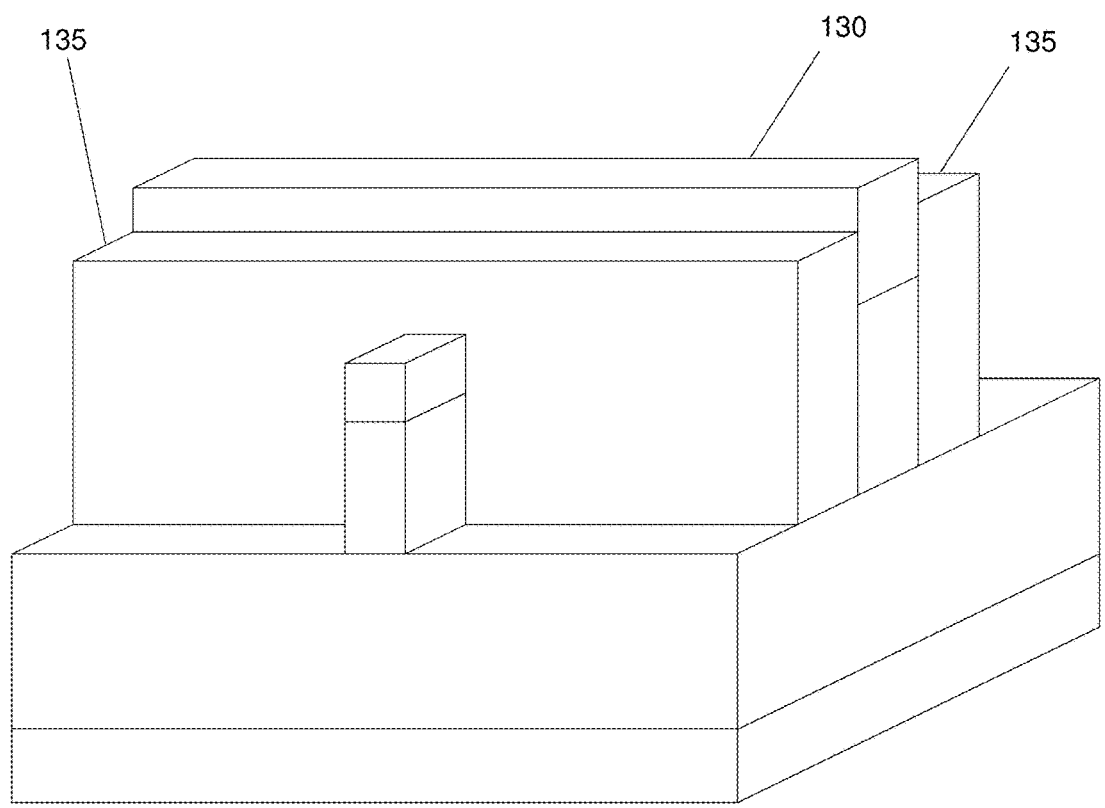

FIG. 9 shows the formation of oxide sidewall spacers 135 adjacent the sides of the gates 120, 125 and on either side of the fin 110. The oxide sidewall spacers 135 may be formed using conventional techniques, such as for example, CVD and RIE, and may comprise conventional materials, such as, for example, $SiO_2$, SiN, etc. In embodiments, each oxide sidewall spacer 135 has a depth of about 25 nm.

Figure 10:
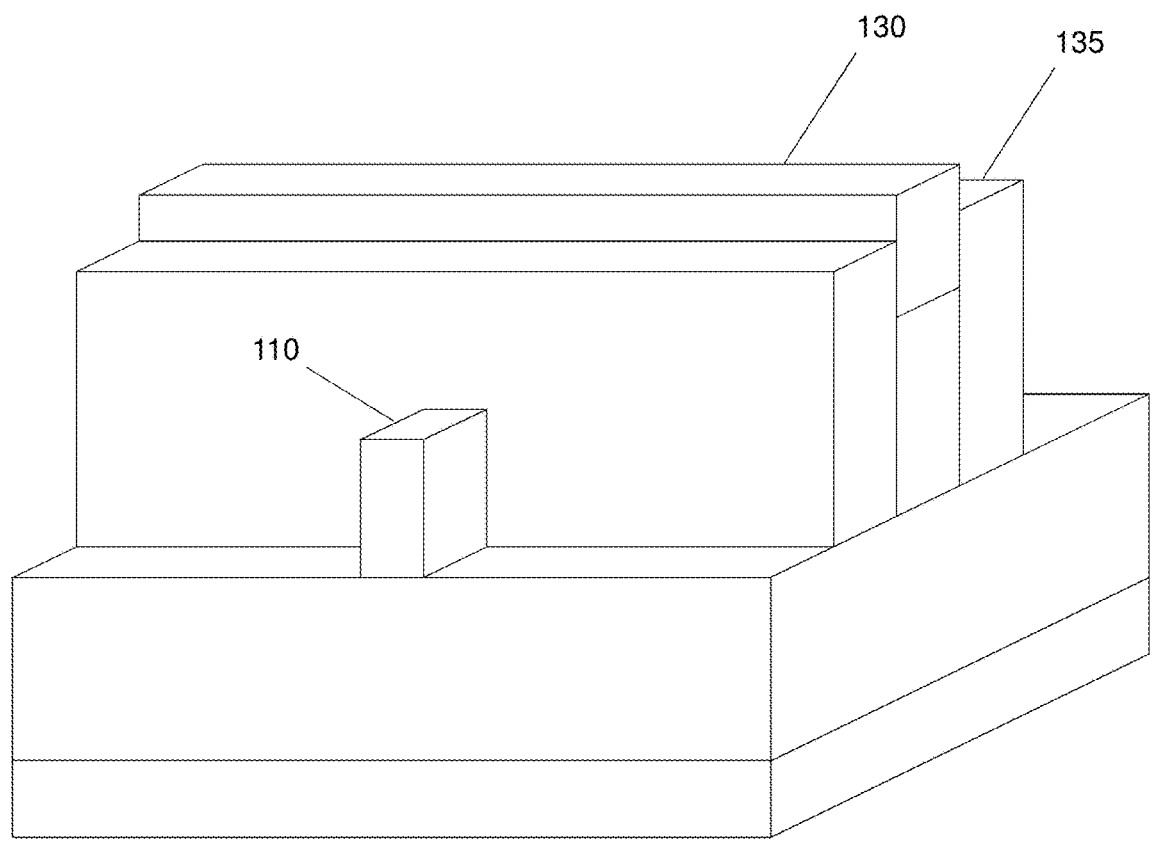
Figure 11:
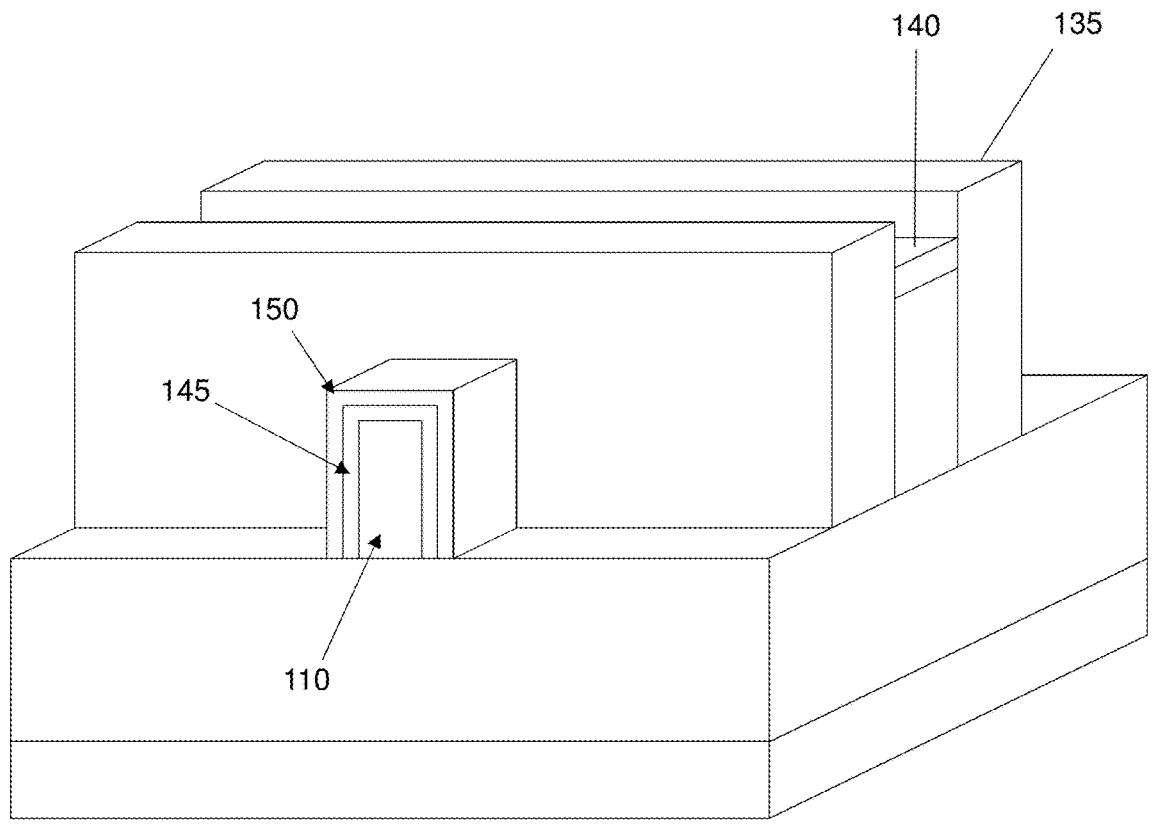

As depicted in FIG. 10, the oxide cap 115 is removed. This may be accomplished in a known manner, such as, for example RIE. And, as shown in FIG. 11, the nitride gate cap 130 is removed. This may be accomplished in a known manner, such as, for example RIE.

Still referring to FIG. 11, silicide 140 is formed over the gates 120, 125. This may be accomplished in a known manner, such as, for example thermal processes. Moreover, an epitaxially grown layer 145 and/or a silicide layer 150 may be formed on the exposed portions (i.e., the source and drain) of the fin 110. The optional epitaxial layer 145 increases the width of the fin 110, which affects the resistance of the fin 110. The optional silicide layer 150 may enhance the conductance of the source/drain. In this manner, either layer 145, 150 (or both layers) may be employed with the invention in order to optimize parameters such as device performance and manufacturing cost, according to the intended use of the invention.

Figure 12A:
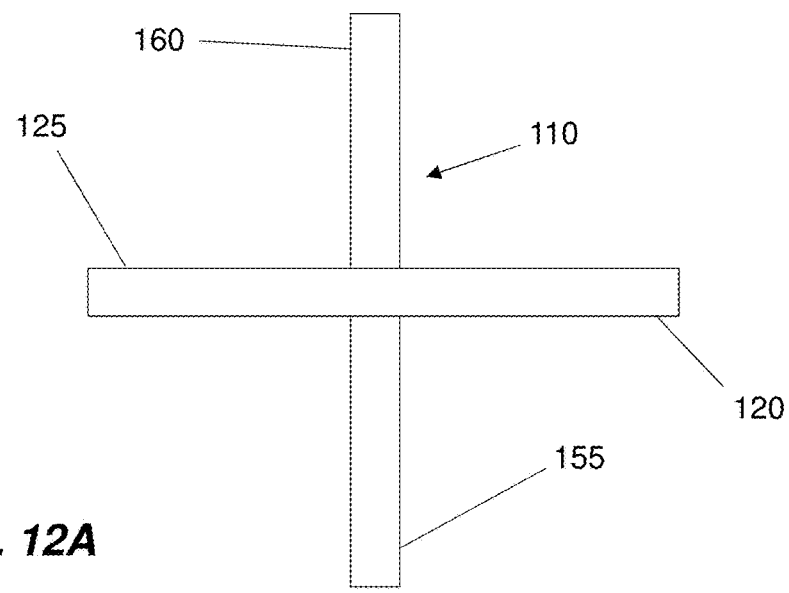
FIGS. 12A-12E show steps of a process for inducing stress in a FINFET according to aspects of the invention.

FIGS. 12A-12E show steps for imparting a bending stress to portions of the fin 110. FIG. 12A shows a top view of the fin 110, including source 155 and drain 160 portions. As described above, the source and drain portions 155, 160, may optionally comprise the epitaxial layer 145 and/or the silicide layer 150 in addition to the material of the fin 110.

Figure 12B:
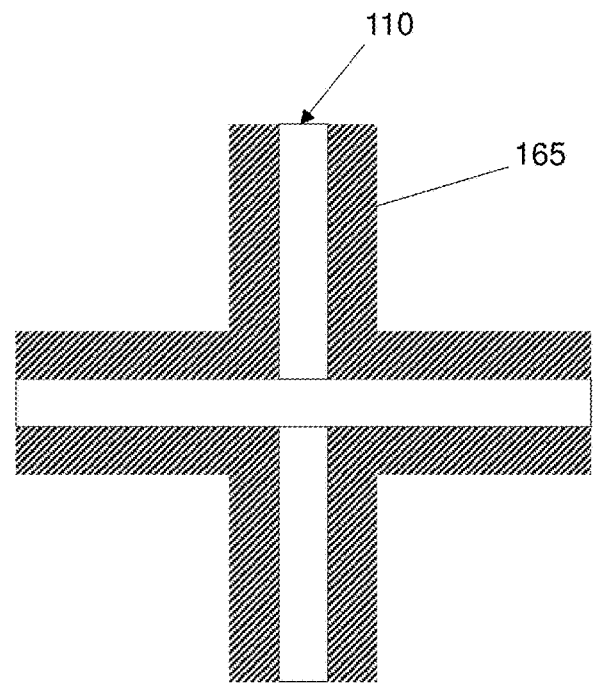

As shown in FIG. 12B, a nitride film 165 is added to both sides of the fin 110. The nitride film 165 is formed such that it possess a stress component. For example, the nitride film 165 may be formed using a plasma chemical vapor deposition (PCVD) process, in which parameters such as plasma power, chamber pressure, chamber temperature, and/or precursor flow rate are adjusted to impart a stress in the nitride film 165. The stress component may be either tensile or compressive. In embodiments, the nitride film 165 is formed substantially equally on either side of the fin 110, such that there is initially no stress differential imposed on the fin 110 by the nitride film 165.

Figure 12C:
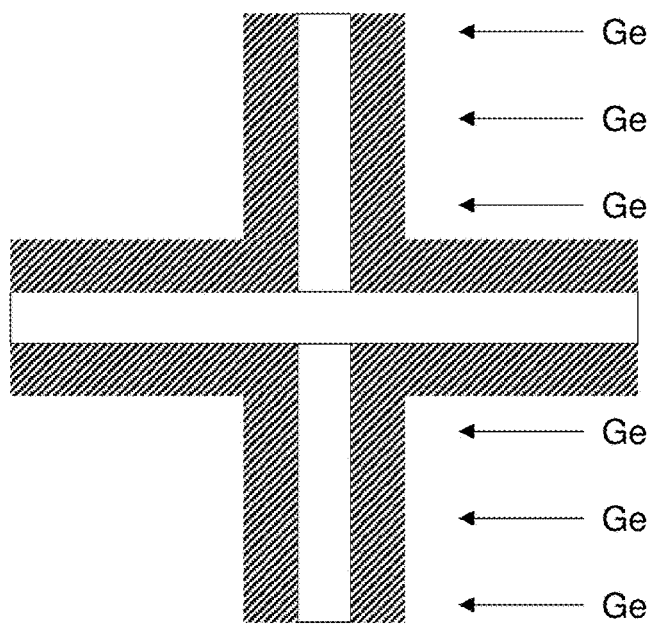
Figure 12D:
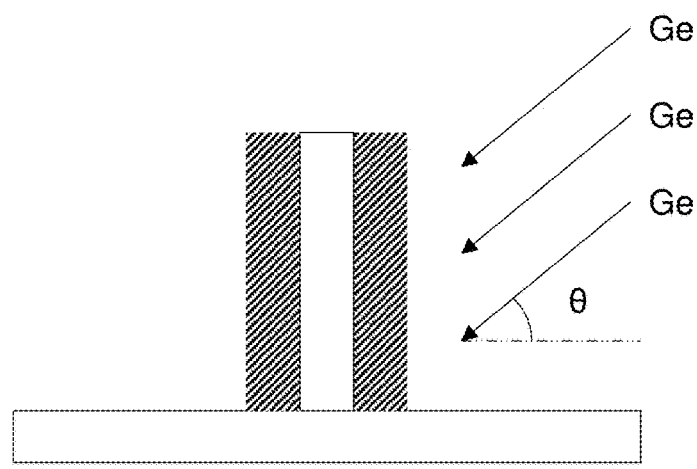

FIGS. 12C and 12D show the steps of creating a stress differential in the nitride film 165. In embodiments, this is accomplished by selectively implanting ions into the nitride film 165 on one side of the fin 110. For example, germanium (Ge) ions may be ion-implanted at an implantation concentration of approximately 1e14 atoms/cm$^2$ to about 1e15 atoms/cm$^2$ and at an implantation energy of about 10 KeV to about 50 KeV. Other implant elements, dosages, and energies may be employed, depending upon the thickness and composition of the nitride film 165.

In embodiments, the implantation occurs at an angle θ of about 25° to about 75° relative to the exposed surface of the targeted side of the nitride film 165, as seen in FIGS. 12C and 12D. This ensures that the implantation substantially only occurs on the targeted side of the nitride layer, and that little or no implantation occurs on the side opposite the targeted side.

Figure 12E:
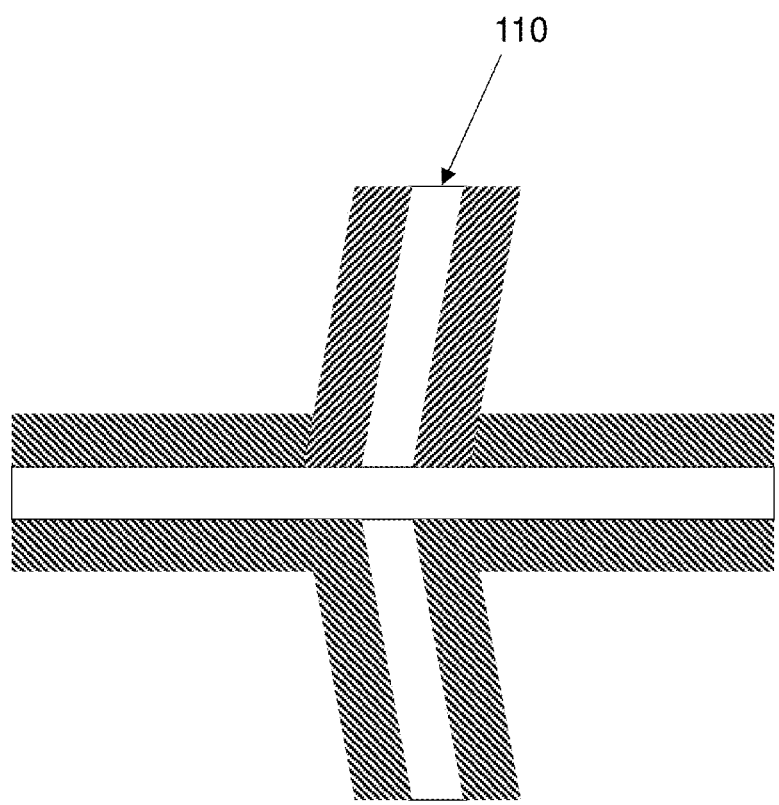

The selective ion-implantation alters (e.g., relaxes) the stress in the portions of the nitride film 165 that are implanted. In this manner, by selectively altering the stress of one side of the nitride film 165, a stress differential is created between the opposed sides of the nitride film 165. Implementations of the invention provide a stress differential of sufficient magnitude to bend the fin 110, as depicted in FIG. 12E.

Figure 13:
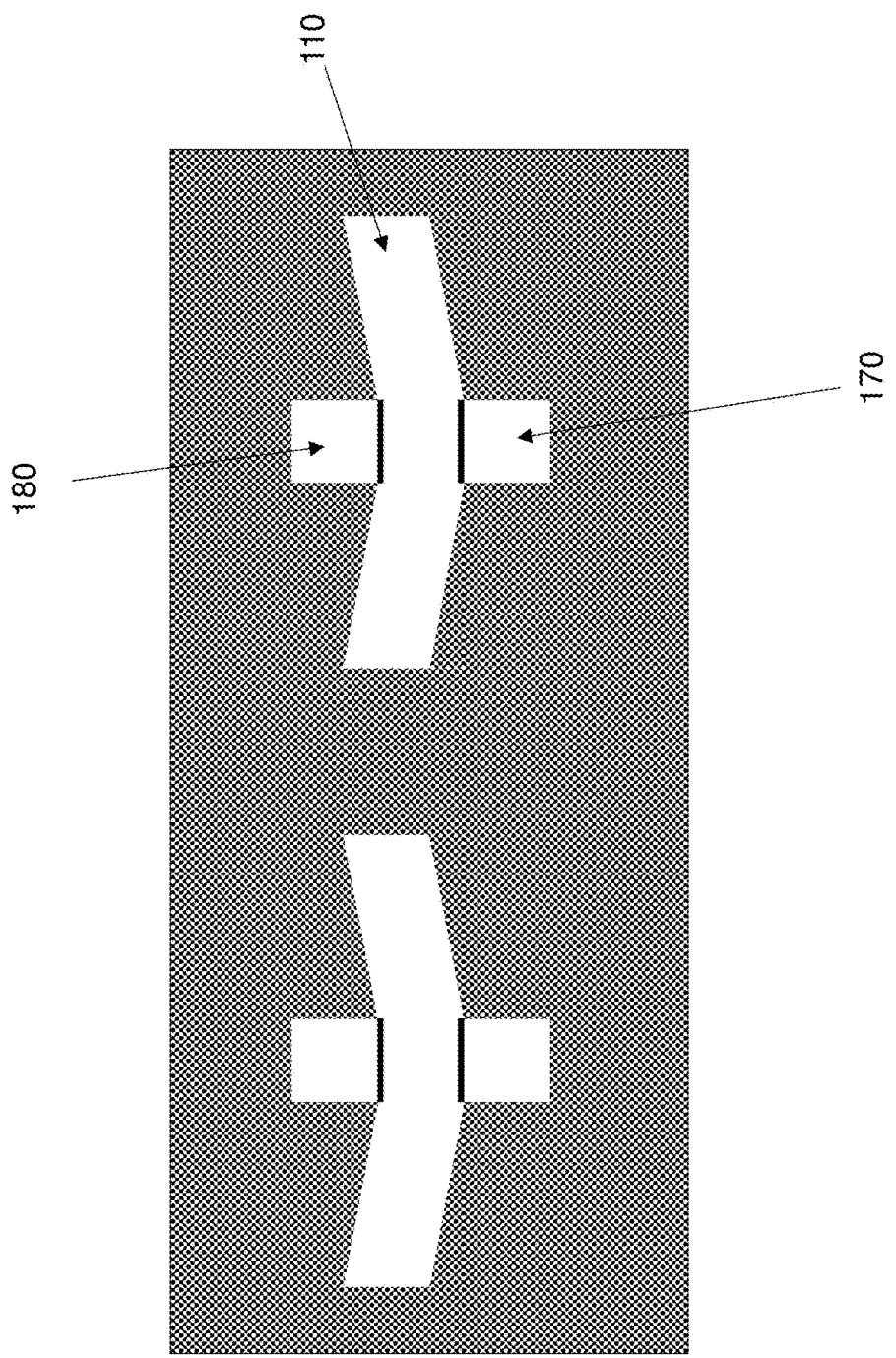
FIG. 13 shows another semiconductor device according to aspects of the invention.

Similar to the bent SOI islands previously described with respect to FIGS. 1-6, the bent fin 110 experiences compressive stress on one side of the bend and tensile stress on another side of the bend. Standard finishing processes may be performed to provide an appropriate frontgate and backgate on the bent fin 110. For example, as shown in FIG. 13, an NFET 170 is provided on the portion of the bent fin 110 with induced tensile stress. As such, the inversion channel area of the NFET 170 is provided with tensile stress. A PFET 180 is provided on the portion of the bent fin 110 with induced compressive stress. As such, the inversion channel area of the PFET 180 is provided with compressive stress. In this manner, the mobility of the FINFET device is enhanced by inducing dual stresses in appropriate portions of the FINFET.

Figure 14:
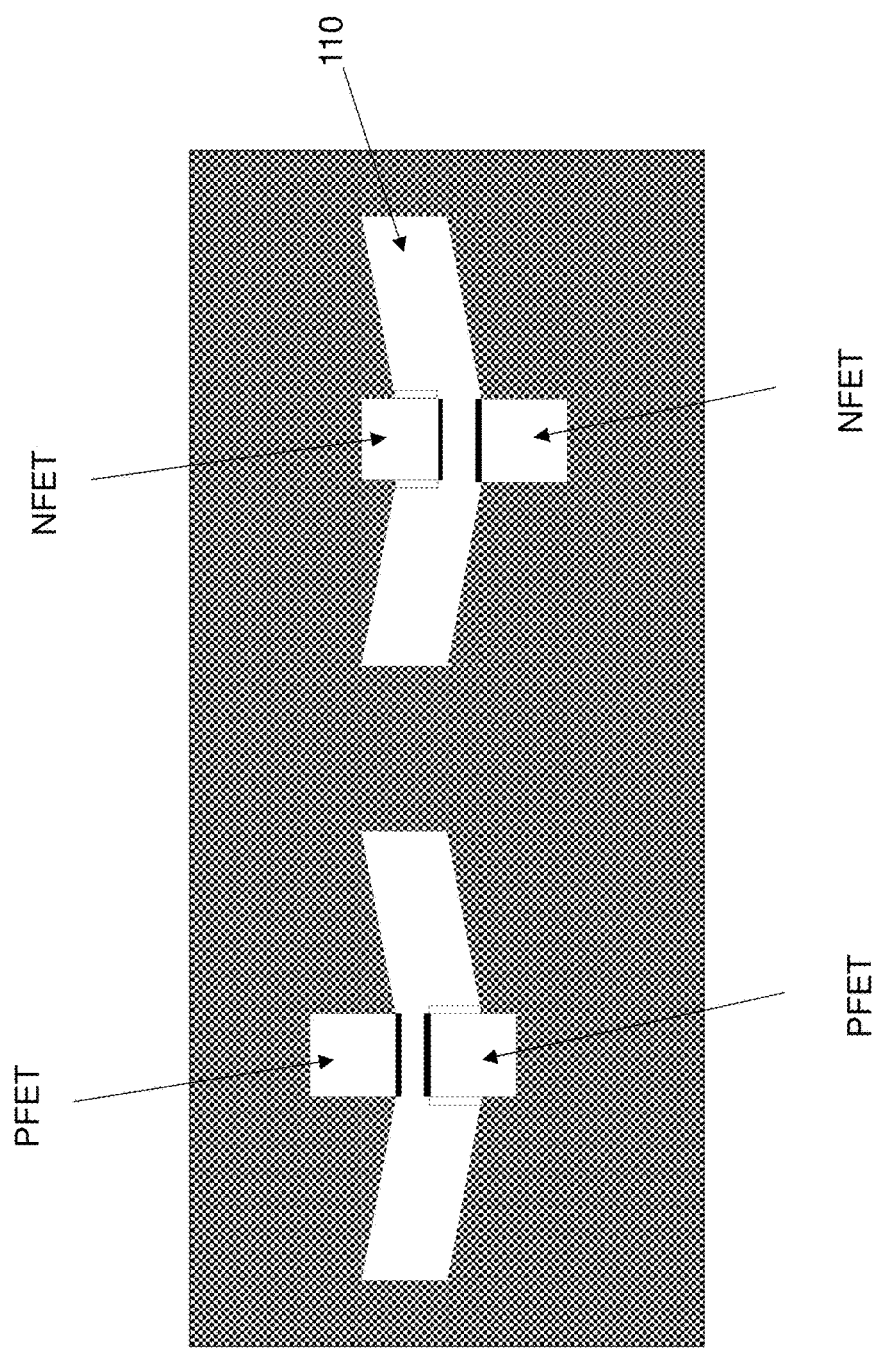
FIG. 14 shows another semiconductor device according to aspects of the invention.

If a trench feature is formed in the fin 110, as previously described with respect to FIG. 7, then the resulting device may take the form of the embodiment shown in FIG. 14. In this embodiment, both gates are disposed in a similarly stressed portion of the bent fin 110. This allows for similar gates to be used on the same fin. For example, in the first device shown in FIG. 14 comprises two PFETs arranged on the portion of the bent fin 110 having induced compressive stress. The second device comprises two NFETs arranged on the portion of the bent fin 110 having induced tensile stress. In this manner, two frontgates (or two backgates) with enhanced mobility may be tied together on the same fin.

The semiconductor device as described above may be part of the design for an integrated circuit chip. In embodiments, the chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII, etc.) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed:

1. A semiconductor structure, comprising:
   semiconductor material having a bend;
   a trench feature on a side surface of the semiconductor material formed at the bend;
   an oxide cap covering the trench and a top surface of the semiconductor material; and
   a gate structure at least partially disposed in the trench feature and extending from both sides of the semiconductor material at the bend,
   wherein the semiconductor material comprises a fin having a first side and a second side opposite the first side.

2. The semiconductor structure of claim 1, further comprising a second gate structure, wherein a first inversion channel region of the gate structure and a second inversion channel region of the second gate structure are at least partially disposed in an area of the fin that has tensile stress induced by the bend.

3. The semiconductor structure of claim 2, wherein the gate structure is included in a first NFET and the second gate structure is included in a second NFET.

4. The semiconductor structure of claim 1, further comprising a second gate structure, wherein a first inversion channel region of the gate structure and a second inversion channel region of the second gate structure are at least partially disposed in an area of the fin that has compressive stress induced by the bend.

5. The semiconductor structure of claim 4, wherein the gate structure is included in a first PFET and the second gate structure is included in a second PFET.

6. A semiconductor structure, comprising:
   a semiconductor fin having a first side, a second side opposite the first side, and a bend;
   a gate structure arranged at the first side of the semiconductor fin such that an inversion channel area of the gate structure is at least partially disposed in a region of the semiconductor fin having stress induced by the bend;
   spacers provided on both sides of the gate structure, extending from the sides of the semiconductor fin and over the semiconductor fin; and
   a silicide on the gate structure which is at a level below a top surface of the spacers.

7. The semiconductor structure of claim 6, further comprising a trench feature formed in the semiconductor fin, wherein the gate structure is at least partially disposed in the trench feature.

8. The semiconductor structure of claim 7, further comprising a second gate structure, wherein a second inversion channel region of the second gate structure is at least partially disposed in the region of the semiconductor fin having stress induced by the bend.

9. The semiconductor structure of claim 8, wherein:
   the stress induced by the bend is a tensile stress in the region of the semiconductor fin; and
   the gate structure is included in a first NFET and the second gate structure is included in a second NFET.

10. The semiconductor structure of claim 8, wherein:
    the stress induced by the bend is a compressive stress in the region of the semiconductor fin; and
    the gate structure is included in a first PFET and the second gate structure is included in a second PFET.

11. The semiconductor structure of claim 6, wherein the region of the semiconductor fin has tensile stress induced by the bend,
    further comprising a second gate structure arranged at the second side of the semiconductor fin such that a second inversion channel region of the second gate structure is at least partially disposed in a second region of the fin having compressive stress induced by the bend.

12. The semiconductor structure of claim 6, further comprising a silicide on the gate structure.

13. The semiconductor structure of claim 6, further comprising an epitaxial layer on a source portion of the fin.

14. The semiconductor structure of claim 13, further comprising a silicide layer on the epitaxial layer.

15. A semiconductor structure, comprising:
   a semiconductor fin having a first side and a second side opposite the first side, wherein the semiconductor fin is bent such that tensile stress is induced in a first region of the semiconductor fin and compressive stress is induced in a second region of the semiconductor fin;
   an oxide cap on the fin structure;
   a trench in one of the first side and the second side of the fin and having a top surface of the trench covered by the oxide cap;
   a gate structure on the semiconductor fin and formed in the trench such that an inversion channel of the gate structure is disposed at least partially in one of the first region and the second region;
   spacers provided on both sides of the gate structure, extending from the sides of the semiconductor fin and over the semiconductor fin; and
   a silicide on the gate structure which is at a level below a top surface of the spacers.

16. The semiconductor structure of claim 15, further comprising:
   a first film having a first stress component on the first side of the semiconductor fin; and
   a second film having a second stress component on the second side of the semiconductor fin,
   wherein the first stress component and the second stress component create a stress differential between the first film and the second film.

17. The semiconductor structure of claim 15, further comprising a second gate structure on the semiconductor fin, wherein:
   the inversion channel region of the gate structure and a second inversion channel region of the second gate structure are at least partially disposed in the first region of the semiconductor fin that has the tensile stress induced at the bend,
   the gate structure is a first NFET and the second gate structure is a second NFET.

18. The semiconductor structure of claim 17, further comprising:
   a first film having a first stress component on the first side of the semiconductor fin; and
   a second film having a second stress component on the second side of the semiconductor fin,
   wherein the first stress component and the second stress component create a stress differential between the first film and the second film.

19. The semiconductor structure of claim 15, further comprising a second gate structure on the semiconductor fin, wherein:
   the inversion channel region of the gate structure and a second inversion channel region of the second gate structure are at least partially disposed in the second region of the semiconductor fin that has the compressive stress induced at the bend,
   the gate structure is a first PFET and the second gate structure is a second PFET.

20. The semiconductor structure of claim 19, further comprising:
   a first film having a first stress component on the first side of the semiconductor fin; and
   a second film having a second stress component on the second side of the semiconductor fin,
   wherein the first stress component and the second stress component create a stress differential between the first film and the second film.

* * * * *